US009653398B1

(12) United States Patent
Kelliher et al.

(10) Patent No.: US 9,653,398 B1
(45) Date of Patent: May 16, 2017

(54) NON-OXIDE BASED DIELECTRICS FOR SUPERCONDUCTOR DEVICES

(71) Applicants: James T. Kelliher, Baltimore, MD (US); Sandro J. Di Giacomo, Ellicott City, MD (US); Cory E. Sherman, Arnold, MD (US); Brian P. Wagner, Baltimore, MD (US)

(72) Inventors: James T. Kelliher, Baltimore, MD (US); Sandro J. Di Giacomo, Ellicott City, MD (US); Cory E. Sherman, Arnold, MD (US); Brian P. Wagner, Baltimore, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/962,981

(22) Filed: Dec. 8, 2015

(51) Int. Cl.
  *H01L 39/24* (2006.01)
  *H01L 23/532* (2006.01)
  *H01L 39/02* (2006.01)

(52) U.S. Cl.
  CPC ........ *H01L 23/53285* (2013.01); *H01L 39/02* (2013.01); *H01L 39/2406* (2013.01)

(58) Field of Classification Search
  CPC . H01L 23/53285; H01L 39/02; H01L 39/025; H01L 39/026; H01L 39/249; H01L 39/2493
  See application file for complete search history.

(56) References Cited

U.S. PATENT DOCUMENTS

| 4,953,005 A | * | 8/1990 | Carlson | H01L 24/86 257/666 |
| 4,960,751 A | * | 10/1990 | Yamazaki | H01L 21/76891 174/257 |
| 5,138,401 A | * | 8/1992 | Yamazaki | H01L 29/437 257/32 |
| 5,212,150 A | * | 5/1993 | Yamazaki | H01L 23/53285 257/663 |
| 5,227,361 A | * | 7/1993 | Yamazaki | H01L 23/53285 257/663 |

(Continued)

FOREIGN PATENT DOCUMENTS

JP    EP 0285445 A2 * 10/1988 ....... H01L 21/76891

OTHER PUBLICATIONS

International Search Report for corresponding PCT/US2016/057178, mailed Jan. 24, 2017.

(Continued)

*Primary Examiner* — Earl Taylor
(74) *Attorney, Agent, or Firm* — Tarolli, Sundheim, Covell & Tummino LLP

(57) ABSTRACT

A method of forming a superconductor device is provided. The method includes depositing a non-oxide based dielectric layer over a substrate, depositing a photoresist material layer over the non-oxide based dielectric layer, irradiating and developing the photoresist material layer to form a via pattern in the photoresist material layer, and etching the non-oxide based dielectric layer to form openings in the non-oxide based dielectric layer based on the via pattern. The method further comprises stripping the photoresist material layer, and filling the openings in the non-oxide based dielectric with a superconducting material to form a set of superconducting contacts.

11 Claims, 6 Drawing Sheets

(56) References Cited

U.S. PATENT DOCUMENTS

| | | | | |
|---|---|---|---|---|
| 5,274,268 | A * | 12/1993 | Yamazaki | H01L 21/76891 257/661 |
| 5,447,908 | A * | 9/1995 | Itozaki | H01L 39/2435 204/192.24 |
| 5,747,873 | A * | 5/1998 | Talisa | H01L 23/49888 257/661 |
| 5,818,071 | A * | 10/1998 | Loboda | H01L 23/5329 257/55 |
| 6,184,477 | B1 * | 2/2001 | Tanahashi | H01L 23/50 174/261 |
| 6,482,656 | B1 * | 11/2002 | Lopatin | H01L 21/288 257/E21.174 |
| 9,082,927 | B1 * | 7/2015 | Pramanik | H01L 39/2493 |
| 2006/0197193 | A1 | 9/2006 | Gu et al. | |
| 2007/0020921 | A1 * | 1/2007 | Chu | H01L 21/02063 438/637 |
| 2007/0037384 | A1 * | 2/2007 | Su | H01L 23/5222 438/637 |
| 2007/0037394 | A1 * | 2/2007 | Su | H01L 21/76808 438/687 |
| 2007/0059923 | A1 * | 3/2007 | Lee | H01L 21/76802 438/637 |
| 2007/0286254 | A1 * | 12/2007 | Fon | G01K 17/006 374/31 |
| 2012/0261788 | A1 * | 10/2012 | Lin | H01L 21/31127 257/506 |
| 2015/0111380 | A1 * | 4/2015 | Chang | H01L 21/0337 438/674 |
| 2015/0119252 | A1 * | 4/2015 | Ladizinsky | B82Y 10/00 505/170 |
| 2015/0143817 | A1 * | 5/2015 | Gervais | H01L 23/34 62/3.1 |
| 2015/0179914 | A1 * | 6/2015 | Greer | H01L 23/53285 505/470 |
| 2015/0179918 | A1 * | 6/2015 | Greer | H01L 39/2493 505/329 |
| 2015/0187840 | A1 | 7/2015 | Ladizinsky et al. | |

OTHER PUBLICATIONS

Lyle, et al: "Static Dielectric Constant of SiC"; Physical Review B, vol. 2, No. 6, Sep. 1, 1970, pp. 2255-2256, XP055334620, ISSN: 0556-2805, DOI: 10.1103/PhysRevB.2.2255; Table 1.

* cited by examiner

NON-OXIDE BASED DIELECTRICS FOR SUPERCONDUCTOR DEVICES

TECHNICAL FIELD

The present invention relates generally to superconductors, and more particularly to superconducting structures and method of making superconducting structures that utilize a non-oxide based dielectric.

BACKGROUND

Superconducting circuits are one of the leading technologies proposed for quantum computing and cryptography applications that are expected to provide significant enhancements to national security applications where communication signal integrity or computing power are needed. They are operated at temperatures<100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Furthermore, the need for low temperature processing currently presents one of the more significant barriers to mass production of superconducting devices.

As superconductor electronics become more prevalent, there is an interest into mass production of superconducting devices utilizing techniques such as is employed in complementary metal oxide semiconductor (CMOS) processing. Microelectronic devices, such as logic devices or memory devices, utilizing superconducting interconnects have different process specifications compared to traditional semiconductor fabrication, such as CMOS processes. One of the problems with employing CMOS processes on devices employing superconducting interconnects is superconducting properties associated with certain superconductive materials are sensitive to oxygen incorporation in the superconductor's microstructure. Recent data indicates oxygen diffusion into the superconductor is strongly dependent on temperature and typical CMOS processing temperatures (e.g., 400° C.) can result in oxygen diffusion from dielectrics that contain oxygen, such as $SiO_2$ formed by plasma decomposition of TEOS (tetra ethyl ortho silicate).

SUMMARY

In one example, a method of forming a superconductor device is provided. The method includes depositing a non-oxide based dielectric layer over a substrate, depositing a photoresist material layer over the non-oxide based dielectric layer, irradiating and developing the photoresist material layer to form a via pattern in the photoresist material layer, and etching the non-oxide based dielectric layer to form openings in the non-oxide based dielectric layer based on the via pattern. The method further comprises stripping the photoresist material layer, and filling the openings in the non-oxide based dielectric layer with a superconducting material to form a set of superconducting contacts.

In another example, a method is provided of forming a superconductor device. The method comprises depositing an amorphous silicon carbide (SiC) based dielectric layer over a substrate, depositing a photoresist material layer over the amorphous SiC based dielectric layer, irradiating and developing the photoresist material layer to form a via pattern in the photoresist material layer, and etching the amorphous SiC based dielectric layer to form openings in the amorphous SiC based dielectric layer based on the via pattern. The method further comprises stripping the photoresist material layer, and filling the openings in the amorphous SiC based dielectric layer with niobium to form a set of superconducting contacts.

In yet a further example, a superconductor device is provided that comprises a substrate, and an active layer overlying the substrate. The device further comprises a non-oxide based dielectric layer overlying the active layer. The non-oxide based dielectric layer includes a plurality of superconducting contacts that extend through the non-oxide based dielectric layer conductively coupled to the active layer.

DETAILED DESCRIPTION

The present invention is directed to employing non-oxide based dielectric material in the fabrication of a superconducting structure (e.g., a superconductor integrated circuit). The non-oxide based dielectric material employed in, for example, interlayer dielectric films, mitigates the diffusion of oxygen into superconducting materials, for example, employed as interconnects in the superconductor structure. The non-oxide dielectric layer can also be used in the fabrication level for superconducting devices, such as superconducting quantum interference devices (SQUIDs). The diffusion of oxygen into superconducting materials has deleterious effects on the superconducting properties of the superconducting material.

The present examples are illustrated with respect to two dielectric layers overlying an active layer. However, it is to be appreciated that a device structure could employ many dielectric layers and active layers in the formation of an integrated superconducting circuit, as long as the interconnect layers employ a non-oxide based dielectric material, and the inteconnects coupling the active layers to one another are formed with a superconducting material. An active layer is defined herein as one or more layers supporting superconducting device or circuit elements other than interconnect layers. It is to be appreciated that the building of superconductor logic devices is not limited to one layer, as in the illustrated examples, but can reside across multiple layers. Furthermore, the utilization of non-oxide based dielectrics enable more freedom to place these elements in any layer.

Figure 1:
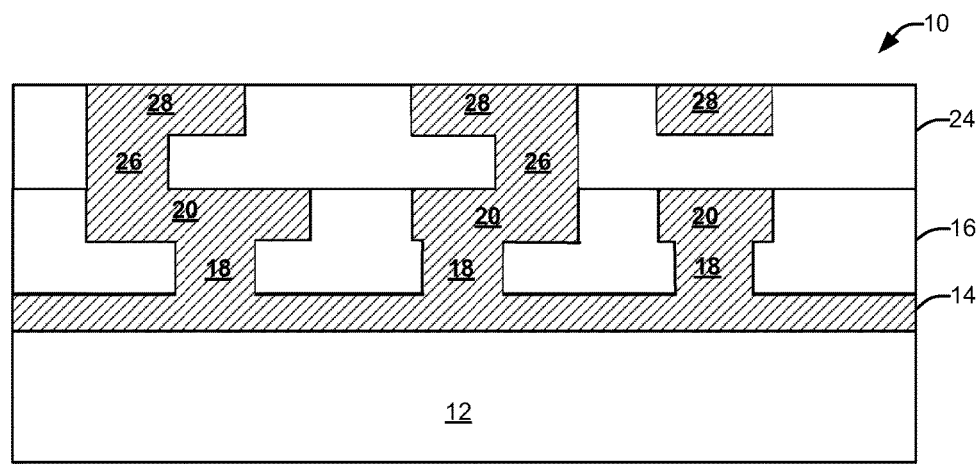
FIG. 1 illustrates cross-sectional view of an example of a superconducting device structure.

FIG. 1 illustrates cross-sectional view of a portion of a superconducting device structure 10 utilizing a non-oxide based dielectric material for interconnect layers between active layers. The superconducting device structure 10 includes an active layer 14 overlying a substrate 12. The substrate 12 can be formed of silicon, glass or other substrate material. The active layer 14 can be a ground layer or a device layer. A first non-oxide based dielectric layer 16 overlies the active layer 14, and a second non-oxide based dielectric layer 24 overlies the first non-oxide based dielectric layer 16. Both the first and the second non-oxide based dielectric layers are formed of a material that contains substantially no oxygen and has a dielectric constant (K) of less than 6, for example, about 3.8 to about 5, such that the dielectric constant is close to or similar to low dielectric constants of oxide based dielectric materials (e.g., $SiO_2$). For example, a non-oxide based dielectric material that could be employed is amorphous silicon carbide (SiC), which has a dielectric constant of about 4.5. Another benefit of amorphous SiC is that it is compatible with common semiconductor processing techniques, such as chemical mechanical polishing, dual damascene and single damascene processing techniques.

A first set of conductive lines 20 extend from a top surface of the first non-oxide based dielectric layer 16 to a first set of contacts 18. The first set of contacts 18 extend to and are conductively coupled to the active layer 14, for example, to other conductive lines, contacts or active devices on the active layer 14. A second set of conductive lines 28 extend from a top surface of the second non-oxide based dielectric layer 24 to a second set of contacts 26. The second set of contacts 26 extend to and are conductively coupled to conductive lines 20 of the first non-oxide based dielectric layer 16. A third conductive line 28 extends from and along a top surface of the second non-oxide based dielectric layer 24 to an intermediate area in the second dielectric layer 24. A plurality of additional active layers and interconnect layers can overlay the second non-oxide based dielectric layer 24 in the same manner as illustrated with respect to the first and second non-oxide based dielectric layers 16 and 24, and the active layer 14.

Each of the contacts and conductive lines are formed of a superconducting material, such as niobium, titanium, aluminum etc., which may have a superconducting property sensitive to oxygen diffusion. Therefore, the utilization of a non-oxide based dielectric in the device structure mitigates the deleterious effects caused by oxygen in the dielectric materials of conventional oxide based dielectrics that affect the superconducting properties of superconductors, for example, by oxygen diffusion.

Turning now to FIGS. 2-10, fabrication is discussed in connection with formation of interconnects in the superconducting device of FIG. 1. It is to be appreciated that the present example is discussed with respect to two interconnect layers above an active layer, however, the methodology can be employed for many more than two interconnect layers between active layers, and a variety of other configurations of active layers and interconnect layers in an integrated circuit.

Figure 2:
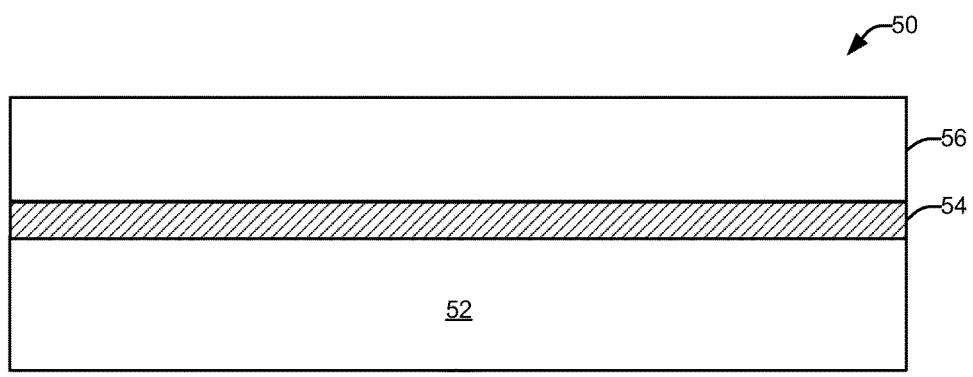
FIG. 2 illustrates a schematic cross-sectional view of an example of a superconductor structure in its early stages of fabrication.

FIG. 2 illustrates a superconductor structure 50 in its early stages of fabrication. The superconductor structure 50 includes an active layer 54, such as a ground layer or device layer, that overlays an underlying substrate 52. The underlying substrate 52 can be, for example, a silicon or glass wafer that provides mechanical support for the active layer 54 and subsequent overlying layers.

A non-oxide based dielectric layer 56 is formed over the active layer 54. Any suitable technique for forming the non-oxide based dielectric layer 56 may be employed such as Low Pressure Chemical Vapor Deposition (LPCVD), Plasma Enhanced Chemical Vapor Deposition (PECVD), High Density Chemical Plasma Vapor Deposition (HDP-CVD), sputtering or spin on techniques to a thickness suitable for providing an interconnect layer. In one example, the non-oxide based dielectric layer 56 can be formed of a non-oxide based dielectric with a dielectric constant (K) of less than 6, for example, about 3.8 to about 5, such that the dielectric constant is close to or similar to a low dielectric constant oxide based dielectric material. The non-oxide based dielectric material can be amorphous silicon carbide (SiC), which has a dielectric constant of about 4.5.

Figure 3:
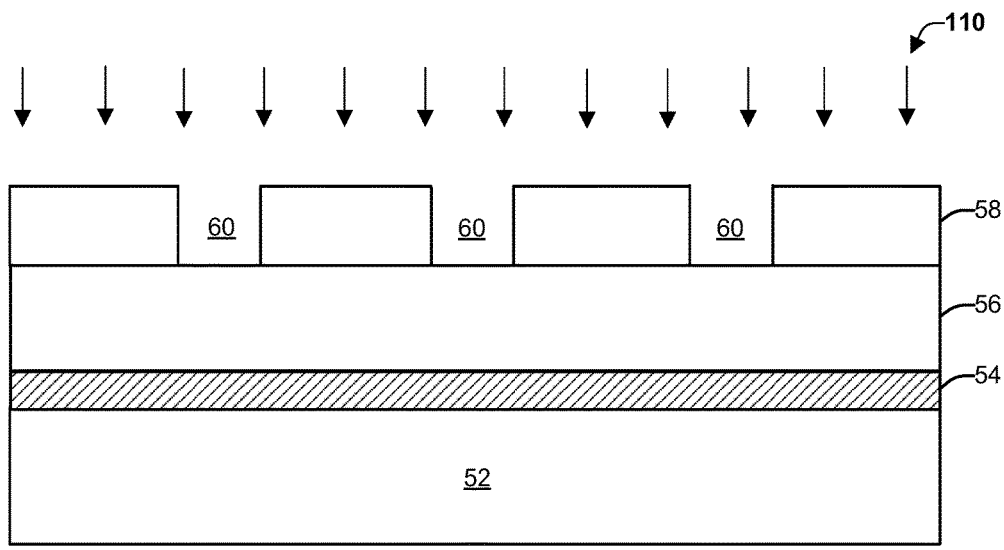
FIG. 3 illustrates a schematic cross-sectional view of the structure of FIG. 2 after a photoresist material layer has been deposited and patterned, and while undergoing an etch process.
Figure 4:
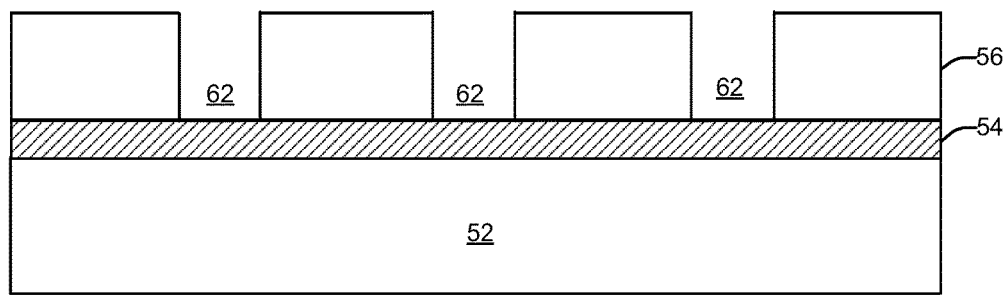
FIG. 4 illustrates a schematic cross-sectional view of the structure of FIG. 3 after the etch process and after the photoresist material layer has been stripped.

Next, as illustrated in FIG. 3, a photoresist material layer 58 is applied to cover the structure and is then patterned and developed to expose open regions 60 in the photoresist material layer 58 in accordance with a via pattern. The photoresist material layer 58 can have a thickness that varies in correspondence with the wavelength of radiation used to pattern the photoresist material layer 58. The photoresist material layer 58 may be formed over the first non-oxide based dielectric layer 56 via spin-coating or spin casting deposition techniques, selectively irradiated and developed to form the openings 60.

FIG. 3 also illustrates performing of an etch 110 (e.g., anisotropic reactive ion etching (RIE)) on the first non-oxide based dielectric layer 56 to form extended openings 62 (FIG. 4) in the first non-oxide based dielectric layer 56 based on the via pattern in the photoresist material layer 58. The etch step 110 can be a dry etch and employ an etchant which selectively etches the underlying first non-oxide based dielectric layer 56 at a faster rate than the underlying active layer 54 and the overlying photoresist material layer 58. For example, the first non-oxide based dielectric layer 56 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 58 to thereby create the extended openings 62. The photoresist material layer 58 is thereafter stripped (e.g., ashing in an $O_2$ plasma) so as to result in the structure shown in FIG. 4.

Figure 5:
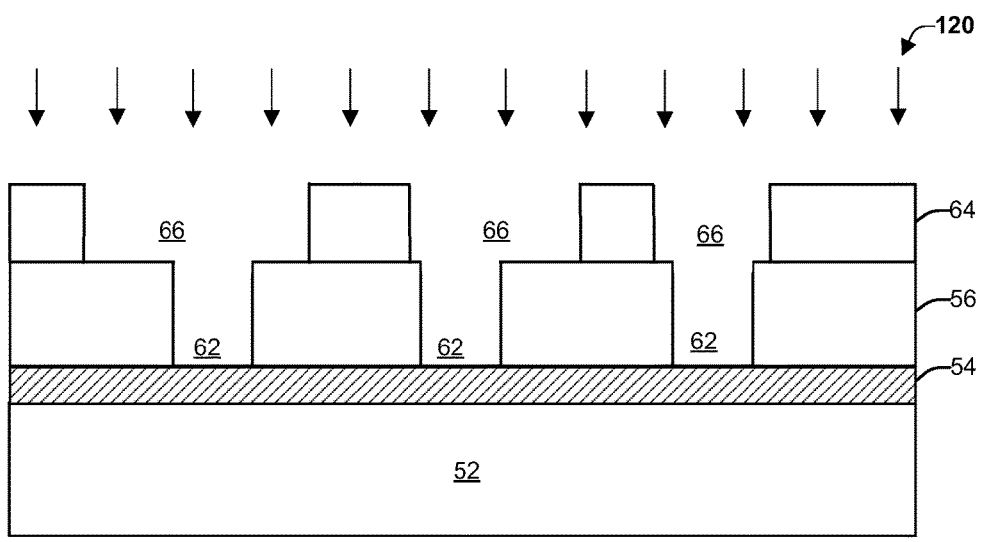
FIG. 5 illustrates a schematic cross-sectional view of the structure of FIG. 4 after a photoresist material layer has been deposited and patterned, and while undergoing an etch process.
Figure 6:
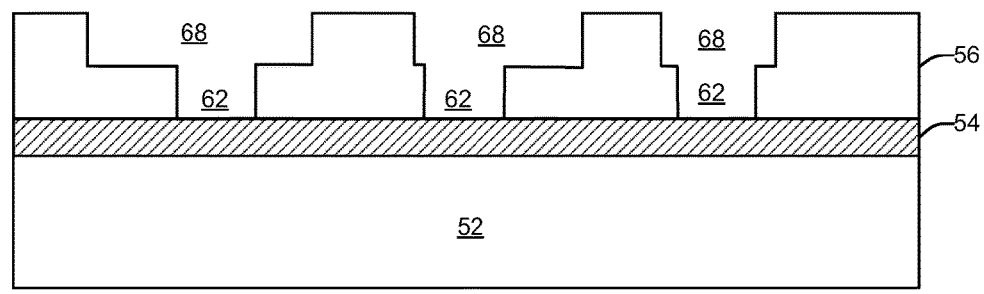
FIG. 6 illustrates a schematic cross-sectional view of the structure of FIG. 5 after the etch process and after the photoresist material layer has been stripped.

Next, as represented in FIG. 5, another photoresist material layer 64 is applied to cover the structure and is then patterned and developed to expose open trench regions 66 in the photoresist material layer 64 in accordance with a trench pattern. FIG. 5 also illustrates performing of an etch 120 (e.g., anisotropic reactive ion etching (RIE)) on the first non-oxide based dielectric layer 56 to form extended openings 68 (FIG. 6) in the first non-oxide based dielectric layer 56 based on the trench pattern in the photoresist material layer 64. The photoresist material layer 64 is thereafter stripped (e.g., ashing in an $O_2$ plasma) so as to result in the structure shown in FIG. 6.

Figure 7:
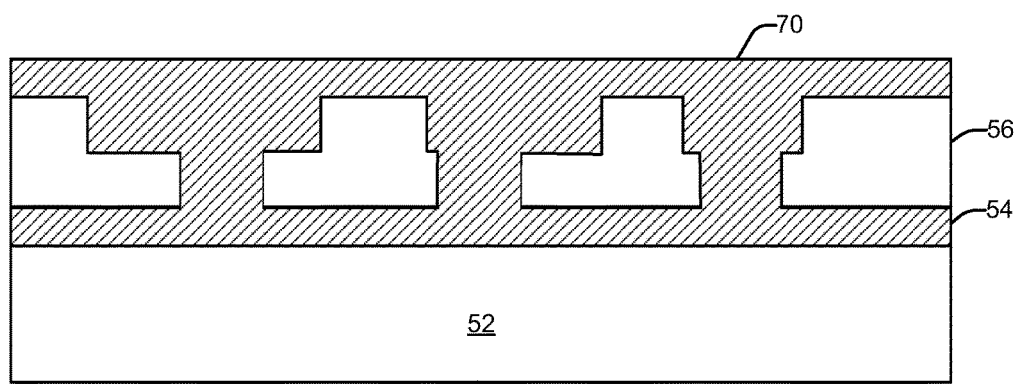
FIG. 7 illustrates a schematic cross-sectional view of the structure of FIG. 6 after a contact material fill.

Next, the structure undergoes a contact material fill to deposit superconducting material 70, such as niobium, into the vias 62 and trenches 68 to form the resultant structure of FIG. 7. The contact material fill can be deposited employing a standard contact material deposition. Following deposition of the contact material fill, the superconducting material 70 is polished via chemical mechanical polishing (CMP) down to the surface level of the non-oxide based dielectric layer 56 to provide the resultant structure of FIG. 8. The resultant structure then includes a first set of conductive lines 74 that extend from a top surface of the first dielectric layer to a first set of contacts 72. The first set of contacts 72 extend to and are conductively coupled to the active layer 54, for example, to other conductive lines, contacts or active devices on the active layer 54.

Figure 8:
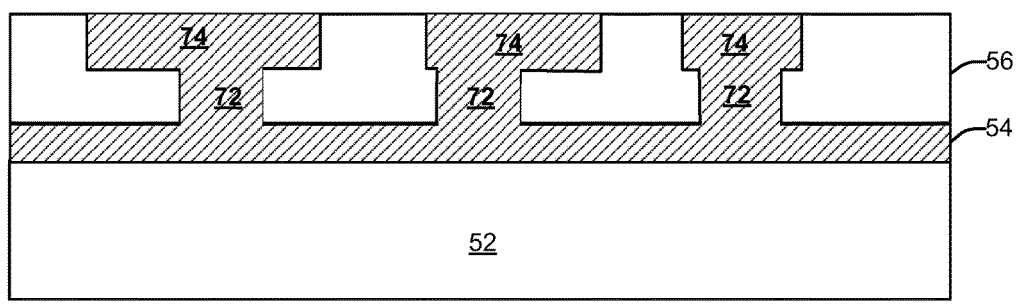
FIG. 8 illustrates a schematic cross-sectional view of the structure of FIG. 7 after undergoing a chemical mechanical polish.
Figure 9:
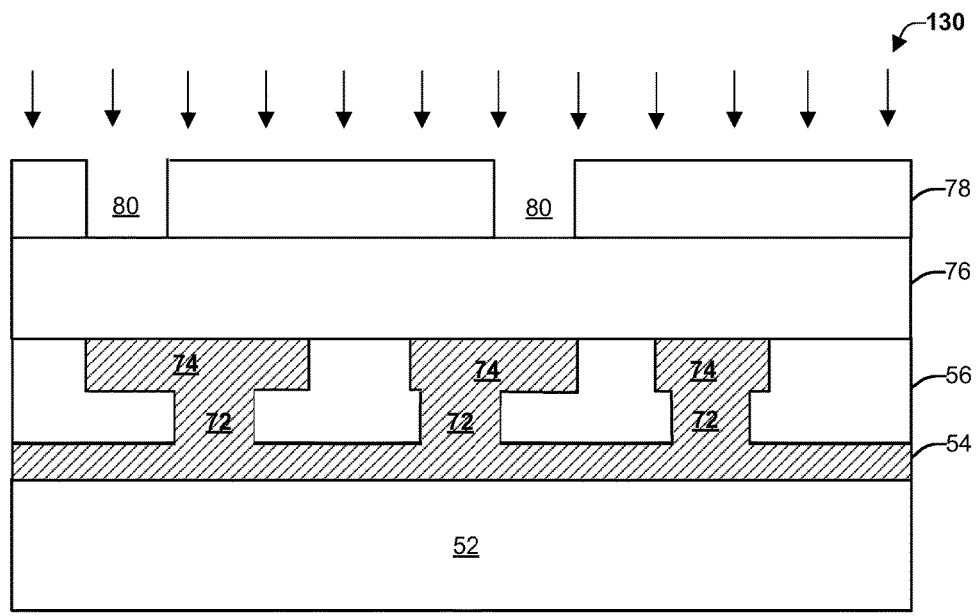
FIG. 9 illustrates a schematic cross-sectional view of the structure of FIG. 8 after a photoresist material layer has been deposited and patterned, and while undergoing an etch process.
Figure 10:
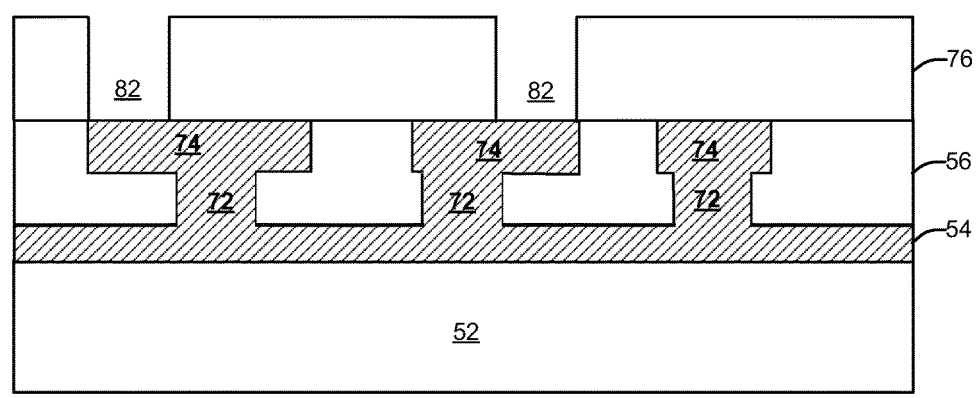
FIG. 10 illustrates a schematic cross-sectional view of the structure of FIG. 9 after the etch process and after the photoresist material layer has been stripped.

Next, as represented in FIG. 9, a second non-oxide based dielectric layer 76 is formed over the structure of FIG. 8. A photoresist material layer 78 is applied to cover the structure and is then patterned and developed to expose open regions 80 in the photoresist material layer 78 in accordance with a via pattern. FIG. 9 also illustrates performing of an etch 130 on the second non-oxide based dielectric layer 76 to form extended openings 82 (FIG. 10) in the second non-oxide based dielectric layer 76 based on the via pattern in the photoresist material layer 76. The photoresist material layer 76 is thereafter stripped (e.g., ashing in an $O_2$ plasma) so as to result in the structure shown in FIG. 10.

Figure 11:
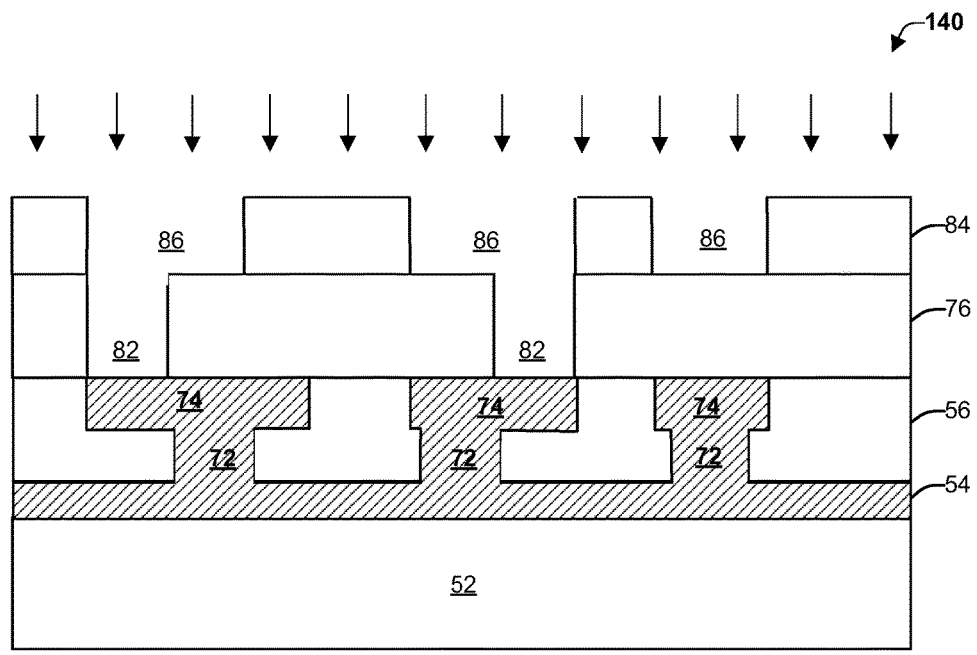
FIG. 11 illustrates a schematic cross-sectional view of the structure of FIG. 10 after a photoresist material layer has been deposited and patterned, and while undergoing an etch process.
Figure 12:
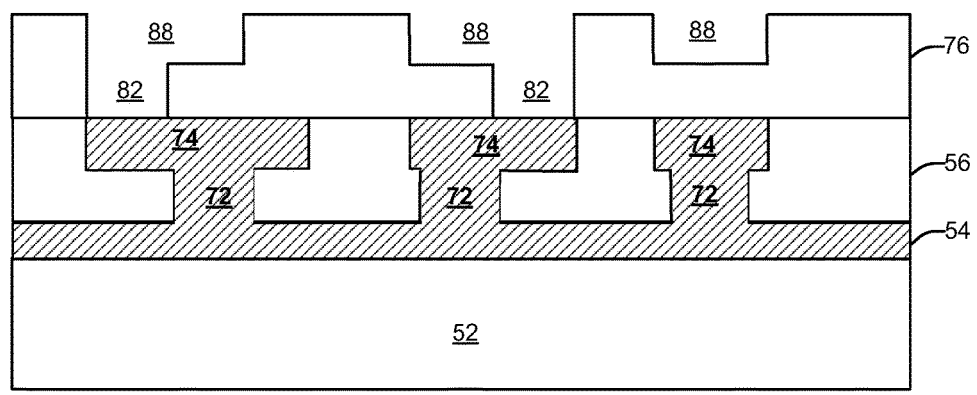
FIG. 12 illustrates a schematic cross-sectional view of the structure of FIG. 11 after the etch process and after the photoresist material layer has been stripped.

Next, as represented in FIG. 11, a photoresist material layer 84 is applied to cover the structure and is then patterned and developed to expose open trench regions 86 in the photoresist material layer 84 in accordance with a trench pattern. FIG. 11 also illustrates performing of an etch 140 (e.g., anisotropic reactive ion etching (RIE)) on the second non-oxide based dielectric layer 84 to form extended openings 88 (FIG. 12) in the second non-oxide base dielectric layer 84 based on the trench pattern in the photoresist material layer 84. The photoresist material layer 84 is thereafter stripped (e.g., ashing in an $O_2$ plasma) so as to result in the structure shown in FIG. 12.

Next, the structure undergoes a contact material fill to deposit superconducting material, such as niobium, into the vias and trenches employing a standard contact material deposition, similar to the process discussed in the description of FIG. 7. Following deposition of the contact material fill, the contact material is polished via chemical mechanical polishing (CMP) down to the surface level of the second non-oxide base dielectric layer 84 similar to the process discussed in the description of FIG. 8. A resultant final structure is provided similar to the structure illustrated in FIG. 1. Additional active layers and non-oxide based dielectric layers can be formed over the structure to repeat the formation of additional interconnect layers to couple active devices to one another from different active layers.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor device, the method comprising:
    depositing a non-oxide based dielectric layer over a substrate;
    depositing a photoresist material layer over the non-oxide based dielectric layer;
    irradiating and developing the photoresist material layer to form a via pattern in the photoresist material layer;
    etching the non-oxide based dielectric layer to form openings in the non-oxide based dielectric layer based on the via pattern;
    stripping the photoresist material layer;
    depositing another photoresist material layer over the non-oxide based dielectric layer;
    irradiating and developing the other photoresist material layer to form a trench pattern in the other photoresist material layer overlying the via pattern;
    etching the non-oxide based dielectric layer to form trench openings in the non-oxide based dielectric layer based on the trench pattern;
    stripping the other photoresist material layer; and
    filling the openings and the trench openings in the non-oxide based dielectric with a superconducting material to form both a set of superconducting contacts and conductive lines that overly the set of superconducting contacts.

2. The method of claim 1, wherein the material that forms the non-oxide based dielectric layer has a dielectric constant of less than 6.

3. The method of claim 2, wherein the material that forms the non-oxide based dielectric layer has a dielectric constant of about 3.8 to about 5.

4. The method of claim 3, wherein the material that forms the non-oxide based dielectric layer is amorphous silicon carbide (SiC).

5. The method of claim 1, wherein the superconducting material is niobium.

6. The method of claim 1, further comprising performing a chemical mechanical polish (CMP) on the superconducting material down to a top surface of the non-oxide based dielectric layer.

7. The method of claim 1, wherein the depositing a non-oxide based dielectric layer over a substrate comprises depositing the non-oxide based dielectric layer over an active layer that overlies the substrate.

8. The method of claim 7, further comprising depositing another non-oxide based dielectrical layer over the non-oxide based dielectric layer and forming another set of superconducting contacts that extend through the other non-oxide based dielectric layer to form a connection between conductive lines overlying the other set of superconductor contacts and the active layer that overlies the substrate.

9. The method of claim 1, further comprising:
    depositing a second non-oxide based dielectric layer over the non-oxide based dielectric layer;
    depositing a second photoresist material layer over the second non-oxide based dielectric layer;
    irradiating and developing the second photoresist material layer to form a via pattern in the second photoresist material layer;

etching the second non-oxide based dielectric layer to form openings in the second non-oxide based dielectric layer based on the via pattern;

stripping the photoresist material layer; and filling the openings in the second non-oxide based dielectric with a superconducting material to form a second set of superconducting contacts.

10. A method of forming a superconductor device, the method comprising:

depositing an amorphous silicon carbide (SiC) based dielectric layer over a substrate;

depositing a photoresist material layer over the amorphous SiC based dielectric layer;

irradiating and developing the photoresist material layer to form a via pattern in the photoresist material layer;

etching the amorphous SiC based dielectric layer to form openings in the amorphous SiC based dielectric layer based on the via pattern;

stripping the photoresist material layer;

depositing another photoresist material layer over the amorphous SiC based dielectric layer;

irradiating and developing the other photoresist material layer to form a trench pattern in the second photoresist material layer overlying the via pattern;

etching the amorphous SiC based dielectric layer to form trench openings in the amorphous SiC based dielectric layer based on the trench pattern;

stripping the other photoresist material layer; and filling the openings and the trench openings in the amorphous SiC based dielectric layer with a niobium to form both a set of superconducting contacts and conductive lines that overly the set of superconducting contacts.

11. The method of claim 10, wherein the depositing the amorphous SiC based dielectric layer over a substrate comprises depositing the amorphous SiC based dielectric layer over an active layer that overlies the substrate, and further comprising depositing another amorphous SiC based dielectric layer over the amorphous SiC based dielectric layer and forming another set of superconducting contacts that extend through the other amorphous SiC based dielectric layer to form a connection between conductive lines overlying the other amorphous SiC based dielectric layer and the active layer that overlies the substrate.

* * * * *